United States Patent
Taniguchi et al.

(10) Patent No.: US 9,424,924 B2
(45) Date of Patent: Aug. 23, 2016

(54) NON-VOLATILE SEMICONDUCTOR MEMORY DEVICE HAVING DEPLETION-TYPE AND ENHANCEMENT-TYPE CHANNEL REGIONS

(71) Applicant: Floadia Corporation, Tokyo (JP)

(72) Inventors: Yasuhiro Taniguchi, Tokyo (JP); Kosuke Okuyama, Tokyo (JP)

(73) Assignee: Floadia Corporation, Kodaira-Shi, Tokyo (JP)

( * ) Notice: Subject to any disclaimer, the term of this patent is extended or adjusted under 35 U.S.C. 154(b) by 4 days.

(21) Appl. No.: 14/228,801

(22) Filed: Mar. 28, 2014

(65) Prior Publication Data

US 2014/0291746 A1 Oct. 2, 2014

(30) Foreign Application Priority Data

Apr. 2, 2013 (JP) ................................. 2013-076945

(51) Int. Cl.

| | |
|---|---|
| G11C 16/04 | (2006.01) |
| H01L 27/108 | (2006.01) |
| G11C 11/34 | (2006.01) |
| H01L 23/48 | (2006.01) |
| H01L 29/36 | (2006.01) |
| H01L 27/115 | (2006.01) |

(52) U.S. Cl.
CPC ........ G11C 16/0425 (2013.01); H01L 27/1156 (2013.01); H01L 27/11519 (2013.01)

(58) Field of Classification Search
CPC ............ H01L 29/7885; H01L 29/7923; H01L 29/7887; H01L 29/7881; H01L 29/7883; G11C 2216/10; G11C 16/0408; G11C 11/5628; G11C 16/12
USPC .................................................. 257/310–320
See application file for complete search history.

(56) References Cited

U.S. PATENT DOCUMENTS

| | | | | |
|---|---|---|---|---|
| 6,034,893 A | * | 3/2000 | Mehta ................ | G11C 16/0441 257/318 |
| 6,044,018 A | * | 3/2000 | Sung .................. | G11C 16/0441 365/185.1 |
| 6,570,212 B1 | * | 5/2003 | Mehta .................. | H01L 27/105 257/314 |
| 8,598,642 B2 | * | 12/2013 | Horch ............... | H01L 29/42324 257/296 |
| 2003/0198086 A1 | * | 10/2003 | Shukuri ................. | B82Y 10/00 365/185.18 |
| 2005/0194633 A1 | * | 9/2005 | Mori ...................... | G11C 16/10 257/324 |
| 2008/0296651 A1 | * | 12/2008 | Yoshida ................ | H01L 27/115 257/315 |
| 2009/0080257 A1 | * | 3/2009 | Oka ...................... | H01L 27/115 365/185.13 |

* cited by examiner

*Primary Examiner* — Marc Armand
*Assistant Examiner* — Nelson Garces
(74) *Attorney, Agent, or Firm* — Fox Rothschild, LLP; Robert J. Sacco; Carol E. Thorstad-Forsyth

(57) ABSTRACT

A non-volatile semiconductor memory device is proposed that has an unprecedented novel structure in which carriers can be injected into a floating gate by applying various voltages of the same polarity. According to the non-volatile semiconductor memory device of the present invention, in a memory transistor, a PN junction is formed at the boundary between a channel region and an opposite polarity type impurity diffusion layer, to allow a floating gate to be charged to have the same polarity as the polarity of the channel region, whereby a part of electrons accelerated in a depletion layer between the channel region and an opposite polarity type extension region, and secondary electrons generated by the accelerated electrons can be injected into the floating gate by being attracted to a gate electrode, as a result of which electrons can be injected into the floating gate even when, without simultaneously applying positive and negative voltages as in the conventional case, various voltages of the same polarity are applied to the floating gate, an impurity diffusion layer, and the opposite polarity type impurity diffusion layer.

8 Claims, 6 Drawing Sheets

NON-VOLATILE SEMICONDUCTOR MEMORY DEVICE HAVING DEPLETION-TYPE AND ENHANCEMENT-TYPE CHANNEL REGIONS

BACKGROUND OF THE INVENTION

1. Field of the Invention

The present invention relates to a non-volatile semiconductor memory device, and is suitably applied to, for example, a non-volatile semiconductor memory device in which data can be written into a memory transistor by injecting electrons into a floating gate.

2. Description of the Related Art

In recent years, the study of non-volatile semiconductor memory devices, which can be easily manufactured by a standard CMOS (Complementary Metal Oxide Semiconductor) process, has been actively conducted. In such non-volatile semiconductor memory devices, an FN (Fowler Nordheim) tunnel injection method, a channel hot electron injection method, and a source side injection method are known as main methods for writing data in a memory transistor having an N-channel MOS (Metal Oxide Semiconductor) structure.

On the other hand, as methods for writing data into a memory transistor having a P-channel MOS structure, there is known a BTBT (band to band tunneling) method in which secondary electrons due to the band-to-band tunneling current are injected into a floating gate. Here, in the BTBT method, electrons can be injected into a floating gate at a relatively low voltage and low power consumption, and as an example of the BTBT method, a method described in U.S. Pat. No. 6,044,018 is known.

In practice, in the non-volatile semiconductor memory device described in U.S. Pat. No. 6,044,018, data can be written in such a manner that, in a memory transistor, band-to-band tunneling current is generated, for example, by applying a positive voltage of 4 to 5 [V] to a floating gate, and by applying a negative voltage of −VCC to a drain region, and that electrons of the drain region are injected into the floating gate by the band-to-band tunneling current.

However, in the non-volatile semiconductor memory device described in U.S. Pat. No. 6,044,018, band-to-band tunneling current is generated by respectively applying positive and negative voltages to the floating gate and the drain region at the time of data writing, and hence a potential difference is increased in correspondence with the difference between the applied positive and negative voltages. On the other hand, in this type of non-volatile semiconductor memory devices, if electrons can be injected into the floating gate at the time of data writing by applying various voltages, such as only positive voltage or only negative voltage, to the floating gate and the drain region, the degree of flexibility in designing a memory transistor, a peripheral circuit, and the like, can be correspondingly improved.

For this reason, as for this type of non-volatile semiconductor memory devices, it is desired to develop a non-volatile semiconductor memory device having an unprecedented novel structure in which electrons can be injected into a floating gate by applying various voltages.

Accordingly, the present invention has been made in view of the above described circumstances, and an object of the present invention is to propose a non-volatile semiconductor memory device having an unprecedented novel structure in which carriers can be injected into a floating gate by applying various voltages.

SUMMARY OF THE INVENTION

In order to solve the above-described problems, according to the present invention, there is provided a non-volatile semiconductor memory device including one or more memory cells each provided with a memory transistor having a floating gate into which carriers can be injected, wherein: the memory transistor includes a N-type or P-type impurity diffusion layer formed in an active region, and a P-type or N-type opposite polarity type impurity diffusion layer formed in the active region and having a polarity opposite to the polarity of the impurity diffusion layer; a gate electrode serving as the floating gate is arranged, via a gate insulating film, on the active region between the impurity diffusion layer and the opposite polarity type impurity diffusion layer; and the channel region between the impurity diffusion layer and the opposite polarity type impurity diffusion layer is made conductive, and thereby carriers are injected into the floating gate by the potential generated at the boundary between the channel region and the opposite polarity type impurity diffusion layer.

According to the present invention, in the memory transistor, a PN junction is formed at the boundary between the channel region and the opposite polarity type impurity diffusion layer, and the floating gate is charged with the same polarity as that of the channel region. Thereby, a part of carriers accelerated in the depletion layer between the channel region and the opposite polarity type impurity diffusion layer, and secondary carriers generated by the accelerated carriers can be injected into the floating gate by being attracted to the gate electrode. In this way, it is possible to realize a non-volatile semiconductor memory device having an unprecedented novel structure in which, without simultaneously applying a positive voltage and a negative voltage as in the conventional case, carriers can be injected into the floating gate by applying various voltages of a same polarity to the floating gate, the impurity diffusion layer, and the opposite polarity type impurity diffusion layer.

DETAILED DESCRIPTION OF THE PREFERRED EMBODIMENTS

In the following, embodiments according to the present invention will be described with reference to the accompanying drawings.

(1) Circuit Configuration of Non-Volatile Semiconductor Memory Device

Figure 1:
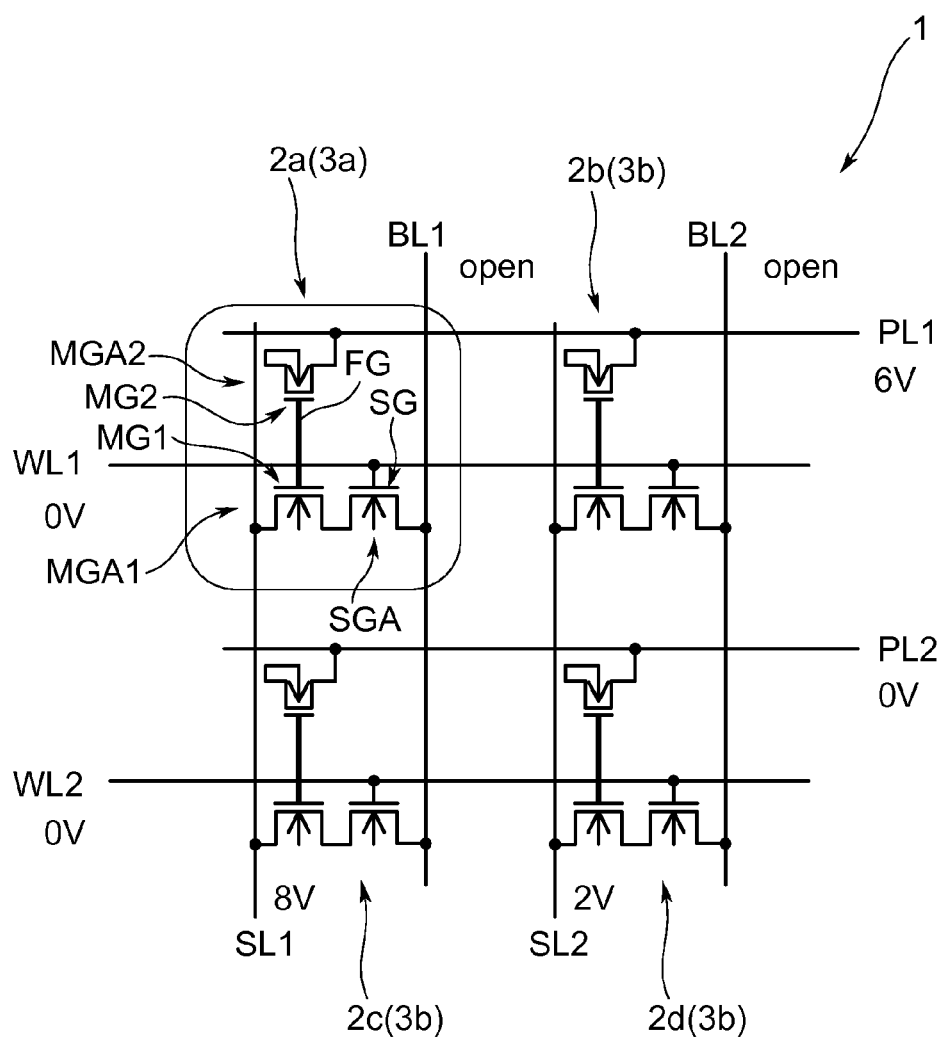
FIG. 1 is a circuit diagram showing a circuit configuration of a non-volatile semiconductor memory device according to the present invention, and voltage values of respective portions of the non-volatile semiconductor memory device at the time of data writing.

In FIG. 1, reference numeral 1 denotes a non-volatile semiconductor memory device in which four memory cells 2a, 2b, 2c and 2d are arranged in two rows and two columns, and which is set so that data can be written into a memory cell, for example, the memory cell 2a arbitrarily selected from these memory cells 2a, 2b, 2c and 2d. In this case, in the non-volatile semiconductor memory device 1, two bit lines BL1 and BL2, and two word lines WL1 and WL2 are provided, and the memory cells 2a, 2b, 2c and 2d are respectively arranged at positions where the bit lines BL1 and BL2 cross the word lines WL1 and WL2.

In practice, in the non-volatile semiconductor memory device 1, the bit line BL1 (BL2) is connected to the memory cells 2a and 2c (2b and 2d) arranged in one direction (here, the longitudinal direction), and the word line WL1 (WL2) is connected to the memory cells 2a and 2b (2c and 2d) arranged in another direction (here, the lateral direction). Also, a program/erase line (write/erase line) PL1 (PL2) is connected to the memory cells 2a and 2b (2c and 2d) connected to the word line WL1 (WL2), so that, by the program/erase line PL1 (PL2), a predetermined voltage can be applied to each of the memory cells 2a and 2b (2c and 2d) arranged in the other direction. Further, a source line SL1 (SL2) is connected to the memory cells 2a and 2c (2b and 2d) connected to the bit line BL1 (BL2), so that, by the source line SL1 (SL2), a predetermined voltage can be applied to each of the memory cells 2a and 2c (2b and 2d) arranged in the one direction.

Here, in the case of the present embodiment, the memory cells 2a, 2b, 2c and 2d all have the same configuration. Therefore, in order to avoid repetitive description, in the following, the description is made by focusing on the memory cell 2a. The memory cell 2a includes a read transistor MGA1 having an N-channel type MOS structure, a switch transistor SGA also having an N-channel type MOS structure, and a memory transistor MGA2 having an N-channel type MOS structure which is featured by including source side and drain side impurity diffusion layers (described below) having opposite polarities. In the memory cell 2a, one floating gate FG is shared by the read transistor MGA1 and the memory transistor MGA2.

The floating gate FG is extended to each of the active regions (described below) of the read transistor MGA1 and the memory transistor MGA2, and can serve as a gate electrode MG1 of the read transistor MGA1 and a gate electrode MG2 of the memory transistor MGA2. Further, in the memory cell 2a, the source line SL1, which is also connected to the other memory cell 2c arranged in the one direction, is connected to one end of the read transistor MGA1, and the program/erase line PL1, which is also connected to the other memory cell 2b arranged in the other direction, is connected to one end of the memory transistor MGA2.

The bit line BL1, which is also connected to the other memory cell 2c arranged in the one direction, is connected to one end of the switch transistor SGA, and the word line WL1, which is also connected to the other memory cell 2b arranged in the other direction, is connected to a switch gate electrode SG so that the switch transistor SGA can be turned on and off when a predetermined voltage is applied to the word line WL1.

Figure 2:
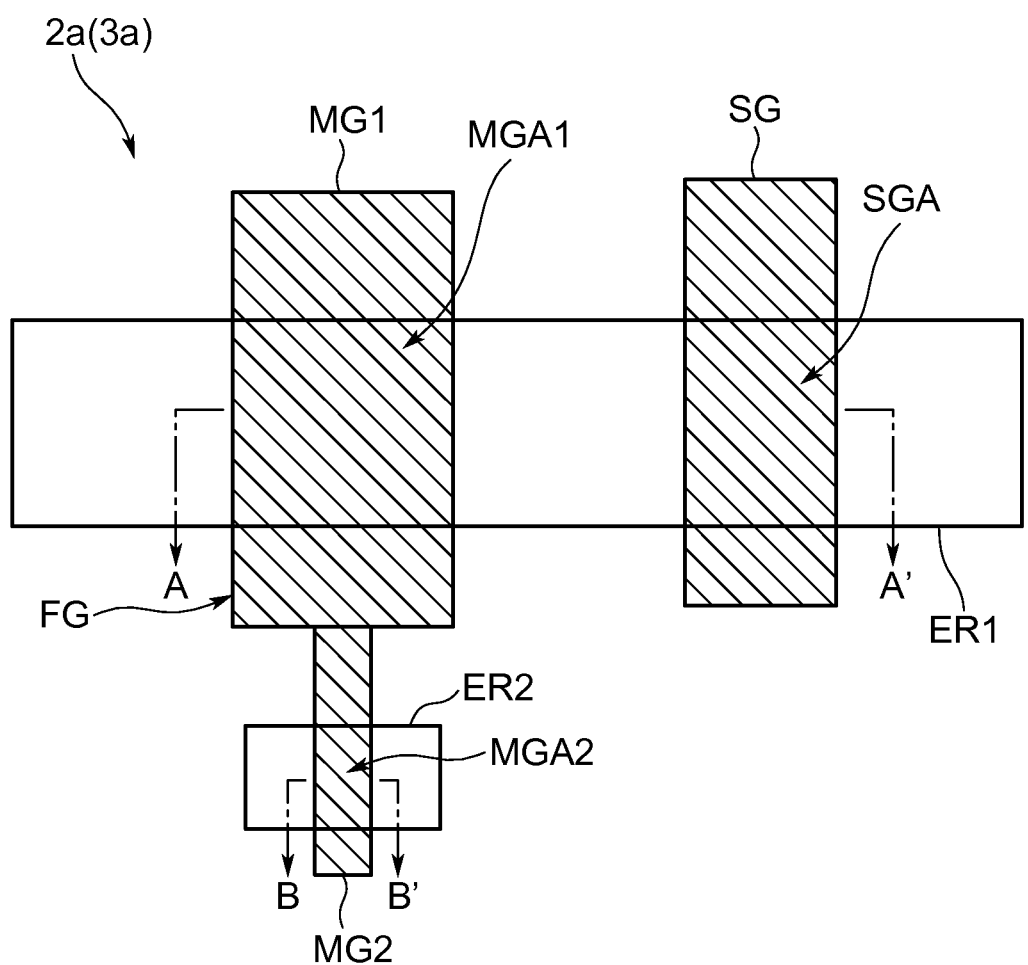
FIG. 2 is a schematic representation showing a layout of the circuit configuration of the memory cell shown in FIG. 1.

Further, the other end of the switch transistor SGA is electrically connected to the other end of the read transistor MGA1, so that the switch transistor SGA is arranged in series with the read transistor MGA1. It should be noted that the other end of the memory transistor MGA2 is short-circuited with a second active region described below. Here, FIG. 2 is a schematic representation showing a layout in which the circuit configuration of the memory cell 2a shown in FIG. 1 is realized. In this case, for example, a P-type first active region ER1 is formed in the memory cell 2a. The gate electrode MG1 of the read transistor MGA1, the gate electrode MG1 configuring the floating gate FG, and a switch gate electrode SG of the switch transistor SGA are arranged on the first active region ER1, so that the read transistor MGA1 and the switch transistor SGA are arranged in series with each other. Further, apart from the first active region ER1, for example, a P-type second active region ER2 is formed in the memory cell 2a. The gate electrode MG2 of the memory transistor MGA2, the gate electrode MG2 being connected to the gate electrode MG1 of the read transistor MGA1, is arranged on the second active region ER2.

In the present embodiment, the region where the gate electrode MG1 of the read transistor MGA1 crosses the first active region ER1 is formed to have an area larger than the area of the region where the gate electrode MG2 of the memory transistor MGA2 crosses the second active region ER2. Therefore, in the read transistor MGA1, potential can be more easily transmitted from the first active region ER1 to the floating gate FG in correspondence with the enlarged area of the crossing region on the side of the gate electrode MG1 of the read transistor MGA1.

Figure 3:
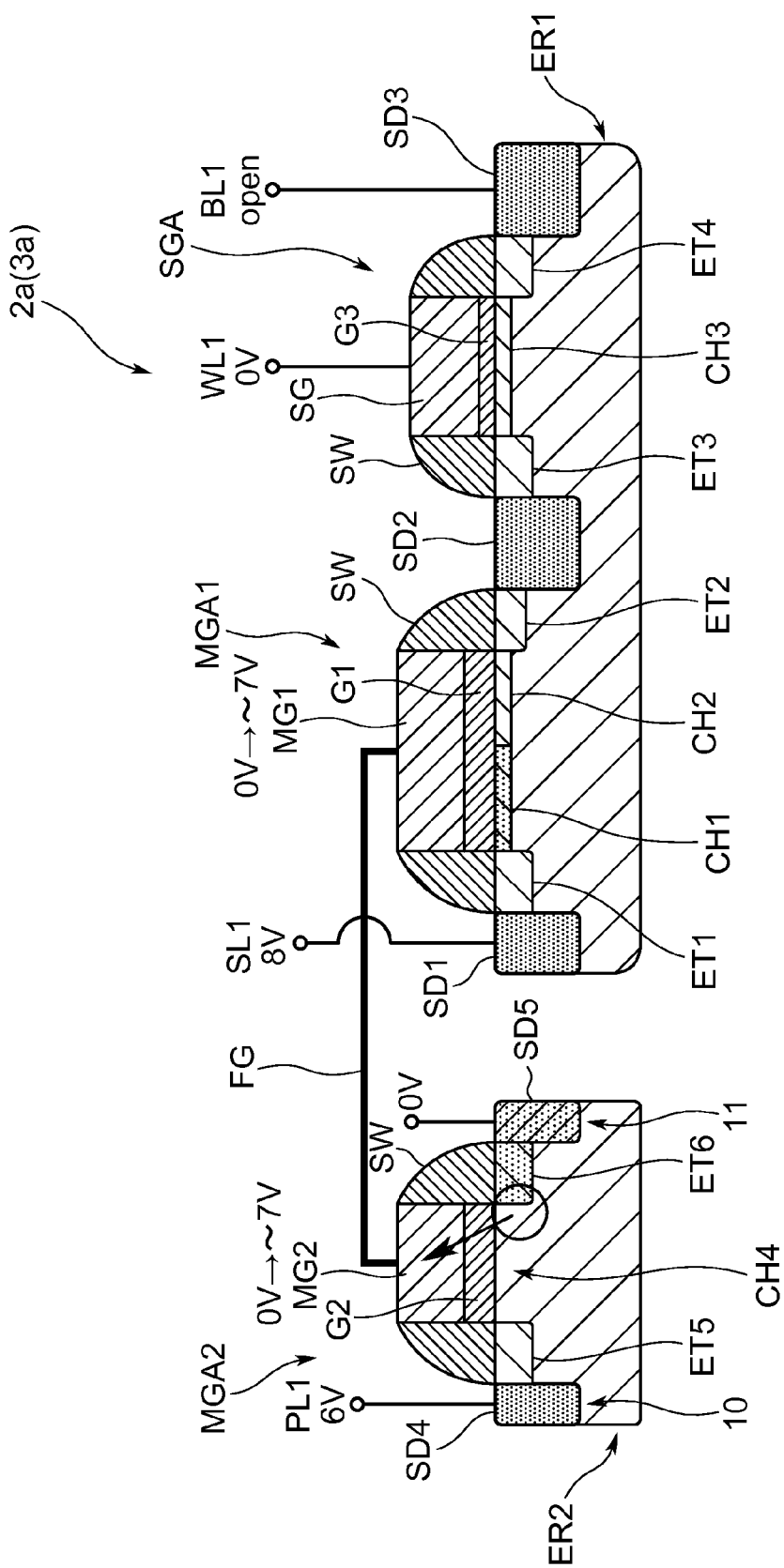
FIG. 3 is a sectional side view showing cross-sectional structures of the A-A' and B-B' portions shown in FIG. 2.

Here, FIG. 3 is a sectional side view showing cross-sectional structures of the A-A' portion (right side in FIG. 3) and the B-B' portion (left side in FIG. 3) in FIG. 2. The switch transistor SGA has a configuration in which N-type source/drain regions SD2 and SD3 are formed at an interval in the first active region ER1, and the bit line BL1 is connected to the source/drain region SD3 serving as one end of the switch transistor SGA. Further, on the upper surface of the first active region ER1 between the source/drain regions SD2 and SD3, N-type extension regions ET3 and ET4 are formed so as to be respectively in contact with the side surfaces of the source/drain regions SD2 and SD3, and a channel region CH3 is formed between the extension regions ET3 and ET4.

The switch transistor SGA has a configuration in which the switch gate electrode SG is provided on the channel region CH3 between the extension regions ET3 and ET4 via a gate insulating film G3, and in which the word line WL1 is connected to the switch gate electrode SG. Further, a side wall SW covering the side surface of the switch gate electrode SG is formed on the upper surface of each of the extension regions ET3 and ET4.

On the other hand, the read transistor MGA1 shares the source/drain region SD2 with the switch transistor SGA and is arranged in series with the switch transistor SGA adjacent to the read transistor MGA1. Further, the read transistor MGA1 has a configuration in which, in the first active region ER1, an N-type source/drain region SD1 is formed at a predetermined interval from the source/drain region SD2, and in which the source line SL1 is connected to the source/drain region SD1 located at one end of the read transistor MGA1, so that a write source voltage, and the like, can be applied to the source/drain region SD1 via the source line SL1.

Further, in the read transistor MGA1, an N-type extension region ET1 in contact with the side surface of the source/drain region SD1 located on the one end, and an N-type extension region ET2 in contact with the side surface of the source/drain region SD2 located on the other end are formed on the upper surface of the first active region ER1. In the read transistor MGA1, on the upper surface of the first active region ER1 between the extension regions ET1 and ET2, the gate electrode MG1 serving as the floating gate FG is formed via a gate insulating film G1. A side wall SW covering each of the both side surfaces of the gate electrode MG1 is formed on the upper surface of each of the extension regions ET1 and ET2.

In addition, in the case of the present embodiment, a depletion-type channel region CH1 in contact with the side surface of the extension region ET1, and an enhancement-type channel region CH2, the both side surfaces of which are respectively in contact with the depletion-type channel region CH1 and the extension region ET2, are formed on the upper surface of the first active region ER1 between the extension regions ET1 and ET2. The depletion-type channel region CH1 is doped with impurities, such as arsenic or phosphorus, so as to be in a depletion state. On the other hand, the channel region CH2 adjacent to the depletion-type channel region CH1 is doped with impurities, such as boron, so as to be in an enhancement state.

In the read transistor MGA1 having the above-described configuration, when, at the time of data writing described below, a write source voltage is applied to the source/drain region SD1 from the source line SL1, the voltage of the depletion-type channel region CH1 and the voltage of the gate electrode MG1 are increased synergistically so that the value of the voltage applied to the gate electrode MG1 can be eventually increased to a value close to the value of the voltage applied to the source line SL1 (as described in detail below).

In addition to the above-described configuration, in the present invention, the memory transistor MGA2, which has an N-channel MOS structure and which is provided separately from the read transistor MGA1 and the switch transistor SGA, has a characteristic configuration in which, at the time of data writing, electrons can be injected into the floating gate FG in the memory transistor MGA2, and in which, at the time of data erasing, data can be erased by injecting holes into the floating gate FG in the memory transistor MGA2.

In practice, as shown in FIG. 3, the memory transistor MGA2 is featured in that an N-type impurity diffusion layer 10, and an opposite polarity type impurity diffusion layer 11 doped with P-type impurities and having a polarity opposite to the polarity of the impurity diffusion layer 10 are formed in the P-type second active region ER2 formed separately from the first active region ER1. The impurity diffusion layer 10 includes an N-type source/drain region SD4, and an N-type extension region ET5 arranged in contact with the side surface of the source/drain region SD4, and has a configuration in which the program/erase line PL1 is connected to the source/drain region SD4.

On the other hand, the opposite polarity type impurity diffusion layer 11 includes a P-type opposite polarity type source/drain region SD5, and a P-type opposite polarity type extension region ET6 arranged in contact with the side surface of the opposite polarity type source/drain region SD5, and has a configuration in which the opposite polarity type extension region ET6 is arranged at a predetermined interval from the extension region ET5.

Further, in the memory transistor MGA2, a channel region CH4 is formed on the upper surface of the second active region ER2 between the extension region ET5 and the opposite polarity type extension region ET6, and the gate electrode MG2 serving as the floating gate FG is formed on the channel region CH4 via a gate insulating film G2. In this way, the memory transistor MGA2 is configured such that the gate electrode MG2 is connected to the gate electrode MG1 of the read transistor MGA1 so that the memory transistor MGA2 can share the floating gate FG with the read transistor MGA1. It should be noted that, on the upper surfaces of the extension region ET5 and the opposite polarity type extension region ET6, a side wall SW is formed so as to cover the both side surfaces of the gate electrode MG2.

Incidentally, the memory cells 2a, 2b, 2c and 2d can be produced by performing each of general CMOS manufacturing processes, such as a film deposition process, a resist application process, an exposure and development process, an etching process, an impurity doping process, and a resist removal process, and hence the description of the production method of the memory cells 2a, 2b, 2c and 2d is omitted here. It should be noted that, although the memory transistor MGA2 has a characteristic configuration in which the N-type impurity diffusion layer 10 is formed at the one end thereof, and in which the P-type opposite polarity type impurity diffusion layer 11 is formed at the other end thereof, the memory transistor MGA2 can be formed by a manufacturing process in which ion implantation for implanting impurities, such as phosphorus, into the N-type region, and ion implantation for implanting impurities, such as boron, into the P-type region are separately performed by using a resist pattern.

(2) Data Writing Operation

Next, in the following, the data writing operation of the non-volatile semiconductor memory device 1 according to the present invention will be described. FIG. 1 shows voltage values at respective portions at the time of writing data only into the memory cell 2a of the first row and first column among the plurality of memory cells 2a, 2b, 2c and 2d. It should be noted that, here, the memory cell 2a, into which data is written, is referred to as a selected memory cell 3a, and the memory cells 2b, 2c and 2d, into which data is not written, are referred to as non-selected memory cells 3b.

In this case, as shown in FIG. 1, at the time of data writing in the non-volatile semiconductor memory device 1, a write voltage of a high voltage of 6 [V] is applied to the program/erase line PL1 connected to the selected memory cell 3a, and a write source voltage of a high voltage of 8 [V] is applied to the source line SL1 connected to the selected memory cell 3a.

Further, the bit line BL1 connected to one end of the switch transistor SGA of the selected memory cell 3a is in an open state, and a voltage of 0 [V] is applied to the switch gate electrode SG from the word line WL1, so that the switch transistor SGA can be set in an off-state. At this time, in the read transistor MGA1 arranged in series with the switch transistor SGA, the write source voltage of the high voltage of 8 [V] is applied, from the source line SL1, to the source/drain region SD1 of the one end of the read transistor MGA1 so that the channel voltage is increased. Thereby, the potential of the channel region CH2 is increased to a value close to the write source voltage value.

That is, in the case of the present embodiment, as shown in FIG. 3, the read transistor MGA1 is configured such that the depletion-type channel region CH1 is formed so as to be in contact with the side surface of the extension region ET1, and thereby, at the time of data writing, the channel voltage of the depletion-type channel region CH1 can be increased to a value corresponding to a threshold voltage Vth (Vth<0) in the depletion state.

For example, in the case where there is no charge in the gate electrode MG1 serving as the floating gate FG, and where the concentration of the depletion-type channel region CH1 is set to correspond to −2 [V] of the threshold voltage Vth, when a voltage of 8 [V] is applied to the source line SL1 at the time of data writing, the potential of the depletion-type channel region CH1 can be first increased to a voltage of 2 [V]. At this time, the potential of the gate electrode MG1 is increased in proportion to the potential of the depletion-type channel region CH1 by capacitive coupling.

For example, in the case where the capacitance ratio of the gate electrode MG1 to the total capacitance (capacitance ratio between the gate electrode MG1 and the depletion-type channel region CH1) is set to 0.5, when the potential of the depletion-type channel region CH1 is increased to the voltage 2 [V], the potential of the gate electrode MG1 is increased from 0 [V] to 1 [V]. It should be noted that, in this case, the efficiency of increasing the voltage of the gate electrode MG1 is improved as the capacitance ratio is increased, and hence it is desirable that the gate electrode MG1 of the read transistor MGA1 is formed to have an area larger than the area of the gate electrode MG2 of the memory transistor MGA2.

Then, in the read transistor MGA1, when the potential of the gate electrode MG1 is increased to become 1 [V], the allowable potential which can be applied to the depletion-type channel region CH1 is also increased, so that the potential of the depletion-type channel region CH1 is further increased by 1 [V], so as to become 3 [V]. Thereby, the potential of the gate electrode MG1 of the read transistor MGA1 is changed in proportion to the potential of the depletion-type channel region CH1 due to the capacitive coupling. When the potential of the depletion-type channel region CH1 is increased to the voltage of 3 [V], the potential of the gate electrode MG1 is increased from 1 [V] to 1.5 [V].

In the read transistor MGA1, the potential of the depletion-type channel region CH1 is increased in correspondence with the potential of the gate electrode MG1. Further, when the channel region CH2 is also set in the on-state, the potential of the channel region CH2 contributes to the capacitive coupling, so that the potential of the gate electrode MG1 is further increased. Eventually, the voltage value of the channel region CH2 can be increased to a value of voltage (for example, about 7 [V]) close to the voltage of 8 [V] applied to the source line SL1. Thereby, in the read transistor MGA1, the voltage of the gate electrode MG1 is increased to a high voltage, so that the voltage of the gate electrode MG2 of the memory transistor MGA2 electrically connected to the gate electrode MG1 can also be increased to a high voltage (for example, about 7 [V]).

In this case, in the memory transistor MGA2, a write voltage of 6 [V] is applied to the N-type source/drain region SD4 on the one end side by the program/erase line PL1, and also a voltage of, for example, 0 [V] is applied to P-type opposite polarity type source/drain region SD5 on the other end side. Therefore, when the voltage of the gate electrode MG2 is increased to a higher voltage, the memory transistor MGA2 can be set in the on-state (conductive state). Thereby, in the memory transistor MGA2, the write voltage applied to the source/drain region SD4 can reach to the opposite polarity type extension region ET6 via the channel region CH4. For this reason, a strong reverse bias is applied between the channel region CH4 and the opposite polarity type extension region ET6, so that junction leakage current can be generated at the boundary between the channel region CH4 and the opposite polarity type extension region ET6.

Thereby, in the depletion layer (not shown) between the channel region CH4 and the opposite polarity type extension region ET6 in the memory transistor MGA2, electrons (carriers) in the opposite polarity type extension region ET6 are accelerated by the potential serving as the generation source of the junction leakage current. Thereby, a part of the accelerated electrons, and secondary electrons generated by the accelerated electrons can be injected into the floating gate FG by being attracted to the gate electrode MG2 charged to the positive polarity the same as the polarity of the channel region CH4. As a result, electrons are accumulated in the floating gate FG in the memory transistor MGA2, so that the selected memory cell 3a can be set in a data written state.

On the other hand, a write inhibit voltage of 0 [V] is applied to the program/erase line PL2 connected only to the non-selected memory cells 3b, and also a voltage of 0 [V] is similarly applied to the word line WL2 connected only to the non-selected memory cell 3b. Thereby, in the non-selected memory cells 3b (memory cells 2c and 2d) to which the write inhibit voltage of 0 [V] is applied from the program/erase line PL2, a voltage of 0 [V] is applied to the source/drain region SD4 on the one end side of the memory transistor MGA2. As a result, even when the channel region CH4 is set in the on-state (conductive state), a reverse bias is not applied between the channel region CH4 and the opposite polarity type extension region ET6. Therefore, in the non-selected memory cells 3b (memory cells 2c and 2d), junction leakage current is not generated at the boundary between the channel region CH4 and the opposite polarity type extension region ET6, and hence electrons are not injected into the floating gate FG.

Further, a write inhibit source voltage of, for example, 2 [V] is applied to the source line SL2 connected only to the non-selected memory cells 3b. Incidentally, the write inhibit source voltage applied to the source line SL2 may be selected to be a value of voltage which prevents the value of voltage of the floating gate FG of the read transistor MGA1 from being increased in correspondence with the voltage of the depletion-type channel region CH1. For example, the write inhibit source voltage applied to the source line SL2 may be about a half or less of the write source voltage applied to the source line SL1 (may be 4 [V] or less because the write source voltage is set to 8 [V] in the present embodiment), and in other case, may be a voltage from 0 to VCC [V]. It should be noted that, in this case, the bit line BL2 connected only to the non-selected memory cells 3b is also set in the open state.

Thereby, among the non-selected memory cells 3b connected to the source line SL2, for example, in the memory cell 2b connected to the program/erase line PL1 to which the write voltage of 6 [V] is applied, the value of voltage of the floating gate FG in the read transistor MGA1 is not increased. Thereby, in the memory transistor MGA2, since the channel region CH4 is set in the off-state (non-conductive state), junction leakage current is not generated, and hence electrons are not injected into the floating gate FG.

Incidentally, among the non-selected memory cells 3b connected to the source line SL2, in the memory cell 2b connected to the program/erase line PL1 to which the write voltage of 6 [V] is applied, for example, even in a state where electrons are already injected into the floating gate FG so that data is written, the voltage difference between the source/drain region SD4 and the floating gate FG is reduced by applying a write inhibit source voltage of 2 [V] to the source line SL2. Thereby, it is prevented that holes are injected, by the write voltage of 6 [V], into the floating gate FG whose voltage is reduced to a negative voltage by the injection of electrons, and hence the written state of data can be maintained as it is.

In this way, in the non-volatile semiconductor memory device 1, electrons are not injected into the floating gate FG of the non-selected memory cells 3b, and data can be written only in the desired selected memory cell 3a in such a manner that junction leakage current is generated in the selected memory cell 3a, and that electrons are injected into the floating gate FG of the selected memory cell 3a by the potential serving as the generation source of the junction leakage current.

Here, in the above-described embodiment, a case is described in which the depletion-type channel region CH1 and also the enhancement type channel region CH2 are formed in the channel layer of the read transistor MGA1. However, the present invention is not limited to this, and for example, the entire channel layer of the read transistor MGA1 may be formed as the depletion-type channel region CH1.

However, when the entire channel layer is formed as the depletion-type channel region CH1, it is necessary to increase the gate length of the gate electrode MG1 in consideration of the short channel effect.

Further, also when the entire channel layer is formed as the depletion-type channel region CH1, the channel concentration on the side close to the extension region ET1, and the channel concentration on the side close to the extension region ET2 may be changed.

It should be noted that, when the depletion-type channel region CH1 and the enhancement type channel region CH2 are formed, it is preferred that the channel length direction length of the depletion-type channel region CH1 is selected to be longer than that of the channel region CH2. For example, it is desirable that the ratio of the entire gate length of the depletion-type channel region CH1 to the entire gate length of the channel region CH2 is set as X:1 (X>1). When the channel length direction length of the depletion-type channel region CH1 is selected to be longer than that of the channel region CH2, the floating potential at the time of writing operation can be further increased.

(3) Data Reading Operation

Figure 4:
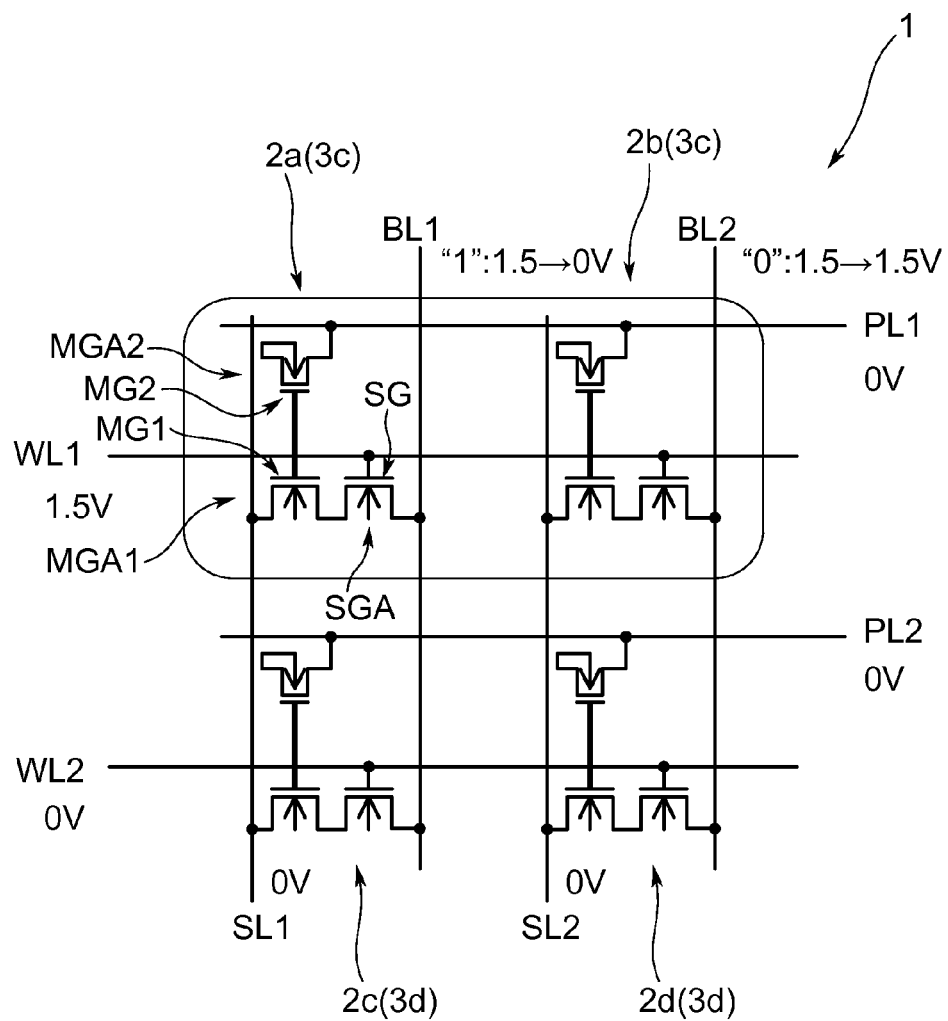
FIG. 4 is a circuit diagram showing voltage values of respective portions at the time of data reading.

Next, in the following, application of voltage at the time of data reading in the non-volatile semiconductor memory device 1 will be described. FIG. 4, in which portions corresponding to the portions in FIG. 1 are denoted by the same reference characters, shows voltage values of the respective portions at the time of reading data of the memory cells 2a and 2b of the first row among the memory cells 2a, 2b, 2c and 2d. It should be noted that, here, the memory cells 2a and 2b, from which data are read, are referred to as read memory cells 3c, and the memory cells 2c and 2d, from which data are not read, are referred to as non-read memory cells 3d. Further, in this case, it is assumed that data is written only in the memory cell 2b among the memory cells 2a, 2b, 2c and 2d, and that no data is written in the other memory cells 2a, 2c and 2d. Here, it is further assumed that the state where electrons are accumulated in the floating gate FG (where data is written) is set as "0", and that the state where electrons are not accumulated in the floating gate FG (where no data is written) is set as "1".

In this case, in the non-volatile semiconductor memory device 1, a read voltage of, for example, 1.5 [V] is applied to the bit lines BL1 and BL2 connected to the read memory cells 3c, so as to pre-charge the bit lines BL1 and BL2, and a voltage of 1.5 [V] is applied to the word line WL1 connected to the read memory cells 3c, so as to set the switch transistor SGA in the on-state. On the basis of a change in the read voltage of these bit lines BL1 and BL2, it is possible to determine whether or not data is written. It should be noted that, in the non-volatile semiconductor memory device 1, a voltage of 0 [V] is applied to the word line WL2 connected only to the non-read memory cells 3d, so as to set each of the switch transistors SGA of the non-read memory cells 3d into the off-state to thereby prevent the read voltage of bit lines BL1 and BL2 from being influenced by the non-read memory cells 3d.

Here, for example, in the read memory cell 3c (memory cell 2b) in which electrons are accumulated in the floating gate FG (in which data is written), since the threshold voltage (a voltage at which the read transistor MGA1 is switched from off to on, and hereinafter also referred to as Vth) of the read transistor MGA1 is set to be high, the read transistor MGA1 is operated to be off, and hence the read voltage of the bit line BL2 remains at 1.5 [V]. On the other hand, in the other read memory cell 3c (memory cell 2a) in which electrons are not accumulated in the floating gate FG (in which no data is written), the read transistor MGA1 is operated to be on, and thereby the read voltage of the bit line BL1 is changed to a voltage value lower than 1.5 [V] (for example, 0 [V]). The non-volatile semiconductor memory device 1 can determine read information by detecting the change in the read voltage of each of the bit lines BL1 and BL2, so as to set to "0" the bit line BL2 whose read voltage remains to be 1.5 [V], and so as to set to "1" the other bit line BL1 whose read voltage is changed.

(4) Data Erasing Operation

Next, in the following, application of voltage at the time of erasing data in the memory cells 2a, 2b, 2c and 2d in the non-volatile semiconductor memory device 1 will be described. As a method for erasing data in the non-volatile semiconductor memory device 1, various erasing methods, such as, for example, an erasing method using injection of holes formed by band-to-band tunneling current (here, also referred to as junction leakage current), an erasing method using edge tunneling emission between the edge of the gate electrode MG2 of the memory transistor MGA2, the gate electrode MG2 serving as the floating gate FG, and the source/drain region SD4, and edge tunneling emission between the edge of the gate electrode MG2 and the opposite polarity type source/drain region SD5 (FIG. 3), and an erasing method using FN tunnel emission, may be used as long as each of the methods is a method enabling electrons to be emitted from the floating gate FG or a method enabling holes to be injected into the floating gate FG.

Figure 5:
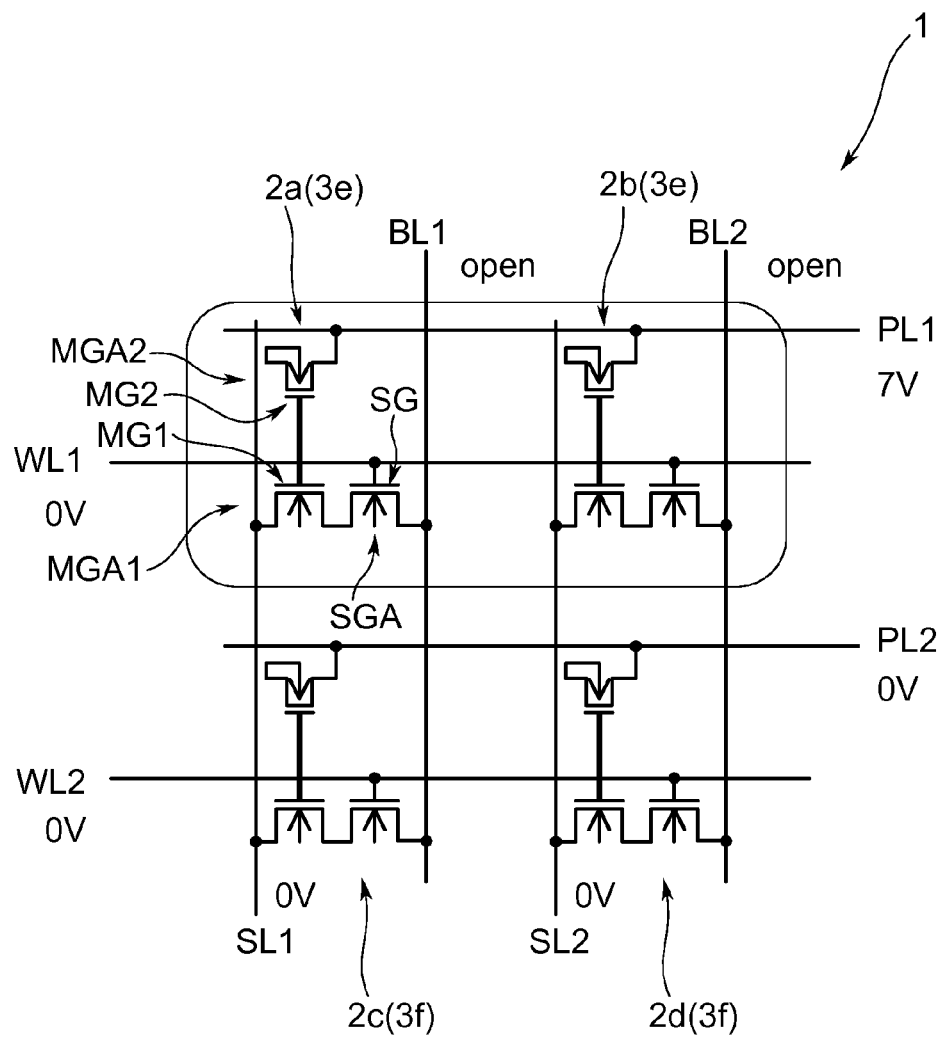
FIG. 5 is a circuit diagram showing voltage values of respective portions at the time of data erasing.

FIG. 5, in which portions corresponding to the portions in FIG. 1 are denoted by the same reference characters, shows voltage values of respective portions in the case where holes formed by band-to-band tunnel current are injected, and shows voltage values of respective portions at the time when, among the memory cell 2a, 2b, 2c and 2d, data of the memory cells 2a and 2b of the first row are erased. It should be noted that, here, the memory cells 2a and 2b, in which data are erased, is referred to as erased memory cells 3e, and the memory cells 2c and 2d, in which data are not erased, are referred to as non-erased memory cells 3f.

In this case, each of the memory cells 2a, 2b, 2c and 2d can be configured such that data erasure can be performed in the memory transistor MGA2 used for data writing, and such that the read transistor MGA1 is not used as a moving path of carriers (electrons or holes) at the time of writing and erasing data. Thereby, even when data writing is repeated in the memory cells 2a, 2b, 2c and 2d, the shift of the threshold voltage (Vth) due to charge transfer is not caused in the read transistor MGA1, and hence the read current obtained from the read transistor MGA1 is not reduced so that occurrence of malfunction can be prevented.

Figure 6:
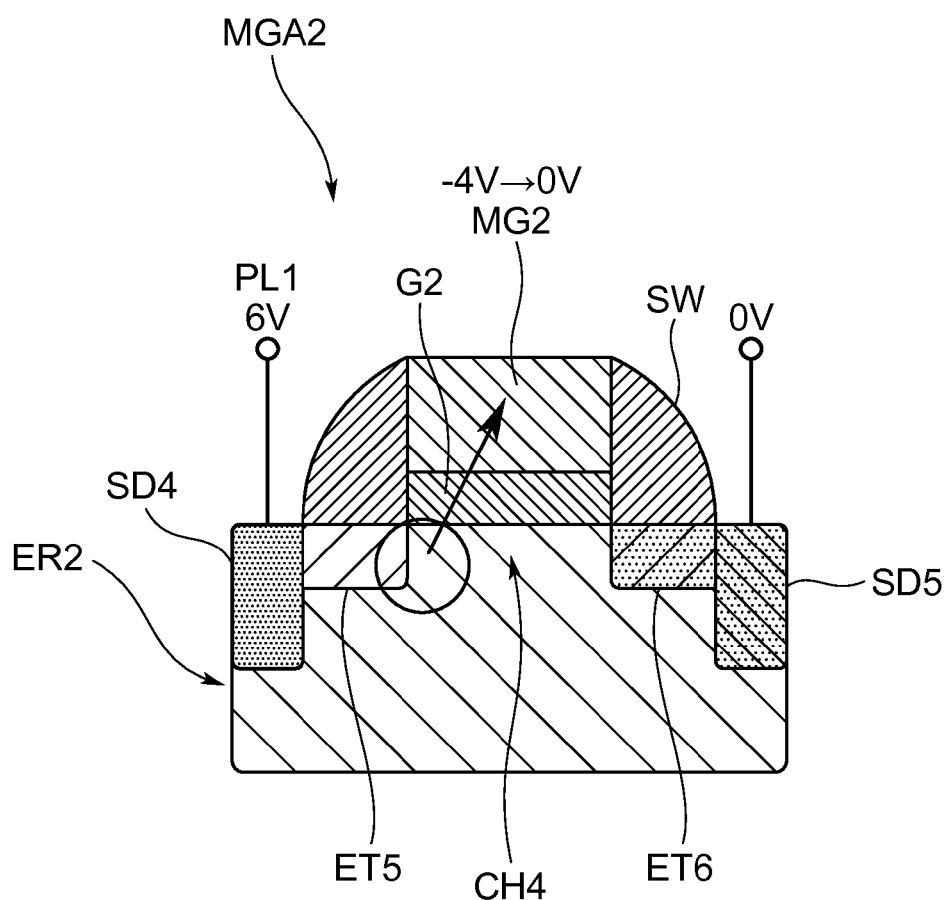
FIG. 6 is a sectional side view showing voltage values of respective portions at the time of data erasing in the memory transistor.

Here, in practice, at the time of data erasing in the non-volatile semiconductor memory device 1, a positive erasing voltage of 7 [V] is applied to the program/erase line PL1 connected to the erased memory cells 3e, and a low voltage of 0 [V] is applied to the source lines SL1 and SL2, and further the bit lines BL1 and BL2 are set in the open state. Thereby, in the memory transistor MGA2 of each of the erased memory cells 3e, the channel region CH4 is set in the off-state (non-conductive state) as shown in FIG. 6, and junction leakage current is generated at the boundary between the source/drain region SD4 on the one side and the channel region CH4. Thereby, holes can be injected into the gate electrode MG2 serving as the floating gate FG by the potential serving as the generation source of the junction leakage current, so that data of each of the erased memory cells 3e can be erased.

Incidentally, here, in the non-erased memory cells 3f in which data is written, electrons are accumulated in the floating gate FG, and hence the potential becomes the negative potential of, for example, −4 [V]. For this reason, at an initial stage of data erasing, much junction leakage current flows through the boundary between the channel region CH4 and the source/drain region SD4 to also increase the electric field perpendicular to the floating gate FG, and hence the hole injection into the floating gate FG is also promoted.

Further, in each of the erased memory cells 3e, when holes are injected into the floating gate FG in the memory transistor MGA2 so that the potential of the floating gate FG becomes close to 0 [V], the channel layer of the read transistor MGA1 is set in the on-state, and the potential of 0 [V] of the source line SL1 is supplied to the depletion-type channel region CH1. Thereby, in each of the erased memory cells 3e, after the floating gate FG is shifted to a stage of being positively charged by the injection of holes, the channel layer of the read transistor MGA1 is fixed to 0 [V] sourced from the source line SL1. Thereby, even when the data erasing is reached to a stage which the floating gate FG is shifted to the positively charged state, the non-volatile semiconductor memory device 1 functions such that the potential of the floating gate FG in the read transistor MGA1 is set close to 0 [V] by the capacitive coupling between the floating gate FG and the depletion-type channel region CH1. This prevents the electric field between the channel region CH4 and the floating gate FG from being decreased by the hole injection. Thereby, the hole injection into the floating gate FG is also promoted even after the floating gate FG is reached to the positively charged state, i.e. in the last half stage of data erasing.

It should be noted that, in this case, as shown in FIG. 5, a voltage of, for example, 0 [V] is applied, as the non-erasing voltage, to the program/erase line PL2 connected only to the non-erased memory cells 3f (memory cells 2c and 2d). Thereby, in each of the non-erased memory cells 3f, the voltage of 0 [V] is applied to the source/drain region SD4 on the one end side of the memory transistor MGA2. This prevents junction leakage current from being generated at the boundary between the source/drain region SD4 on the one end side and the channel region CH4, and hence holes are not injected into the gate electrode MG2 serving as the floating gate FG, so that the data of each of the non-erased memory cells 3f can be prevented from being erased.

In this way, in the non-volatile semiconductor memory device 1, holes are not injected into the floating gate FG of each of the non-erased memory cells 3f, while junction leakage current is generated only in each of the desired erased memory cells 3e. By means of the potential serving as the generation source of the junction leakage current, holes (carriers having the conductivity type opposite to that of the carriers accumulated in the floating gate FG) are injected into the floating gate FG so that data can be erased.

It should be noted that, in the case of the present embodiment, the gate electrode MG1 of the read transistor MGA1, and the gate electrode MG2 of the memory transistor MGA2 are usually formed of polysilicon of the same conductivity type. However, the present invention is not limited to this. For example, the gate electrode MG1 of the read transistor MGA1 may be formed as an N-type gate electrode by doping impurities, such as phosphorus, into the gate electrode MG1, and on the other hand, the gate electrode MG2 of the memory transistor MGA2 causing band-to-band tunneling may be formed as a P-type gate electrode by doping impurities, such as boron, into the gate electrode MG2.

In this case, the difference in the work function between the N-type gate electrode MG1 and the P-type gate electrode MG2 is 1 [V] or more, so that, in the floating gate FG, a potential drop of about 1 [V] can be produced between the N-type gate electrode MG1 and the P-type gate electrode MG2. As a result, as compared with the case where the floating gate is configured only by an N-type gate electrode, the generation efficiency of junction leakage current is improved in the memory transistor MGA2, so that holes can be more easily injected into the floating gate FG.

(5) Operation and Effect

In the above-described configuration, the non-volatile semiconductor memory device 1 is provided with the memory transistor MGA2 which includes: the N-type impurity diffusion layer 10 formed in the second active region ER2; the P-type opposite polarity type impurity diffusion layer 11 similarly formed in the second active region ER2 and having a polarity opposite to the polarity of the impurity diffusion layer 10; and the gate electrode MG2 serving as the floating gate FG and arranged, via the gate insulating film G2, on the second active region ER2 between the impurity diffusion layer 10 and the opposite polarity type impurity diffusion layer 11.

In the non-volatile semiconductor memory device 1, at the time of data writing, the channel region CH4 between the impurity diffusion layer 10 and the opposite polarity type impurity diffusion layer 11 is set in the on-state by adjusting each of the voltages of the impurity diffusion layer 10, the opposite polarity type impurity diffusion layer 11, and the gate electrode MG2, so that a PN junction is formed at the boundary between the channel region CH4 and the opposite polarity type impurity diffusion layer 11, so as to cause junction leakage current at the boundary between the channel region CH4 and the opposite polarity type impurity diffusion layer 11. Thereby, in the memory transistor MGA2, electrons (carriers) in the opposite polarity type extension region ET6 are accelerated in the depletion layer between the channel region CH4 and the opposite polarity type extension region ET6 by the potential serving as the generation source of the junction leakage current, so that a part of the accelerated electrons, and secondary electrons generated by the accelerated electrons can be injected into the floating gate FG by being attracted to the gate electrode MG2 charged to the positive polarity the same as the polarity of the channel region CH4.

In this way, it is possible to realize the non-volatile semiconductor memory device 1 having an unprecedented novel structure configured such that, in the memory transistor MGA2, a PN junction is formed at the boundary between the channel region CH4 and the opposite polarity type impurity diffusion layer 11, and the floating gate FG is charged to the polarity the same as the polarity of the channel region CH4, so that a part of electrons accelerated in the depletion layer between the channel region CH4 and the opposite polarity type extension region ET6, and secondary electrons generated by the accelerated electrons can be injected into the floating gate FG by being attracted to the gate electrode MG2, as a result of which electrons can be injected into the floating gate FG even when, without simultaneously applying positive and negative voltages as in the conventional case, the other various voltages of the same polarity or of opposite polarities are respectively applied to the floating gate FG, the impurity diffusion layer 10, and the opposite polarity type impurity diffusion layer 11.

For example, in the case of the present embodiment, when data is written in the memory transistor MGA2, a positive voltage can be selected as each of the voltages respectively applied to the source/drain region SD4 and the floating gate FG, and hence the difference between the applied voltages can be correspondingly reduced.

Further, in the case of the present embodiment, since the memory transistor MGA2 is configured to have an N-type MOS structure formed in the P-type second active region ER2, it is possible to use, as it is, a P-type semiconductor substrate used as a general semiconductor substrate, and it is not necessary to separately form an N-well in the semiconductor substrate. Therefore, the structure of the memory cell 2a can be correspondingly simplified, and the size of the entire memory cell 2a can be reduced.

Further, the memory transistor MGA2 is configured to have the N-channel MOS structure, and hence, at the time of data reading, on-current of the memory transistor is not reduced, and large on-current can be obtained as compared with the P-channel MOS structure. Therefore, the size of elements of the memory cell 2a can be reduced.

Further, the memory transistor MGA2 is configured such that, at the time of data writing, electrons are injected into the floating gate FG by means of junction leakage current generated at the boundary between the channel region CH4 and the opposite polarity type impurity diffusion layer 11 similarly to the BTBT. Therefore, in the memory transistor MGA2, electrons can be injected into the floating gate FG at lower voltage and lower power consumption as compared with the configuration using FN tunneling, channel hot electron, or the like.

It should be noted that, in the case of the present embodiment, the depletion-type channel region CH1 is formed between the extension regions ET1 and ET2 in the read transistor MGA1, and when, at the time of writing data, the write source voltage of 8 [V] is applied to the one end, the voltage of the gate electrode MG1 serving as the floating gate FG, and the voltage of the depletion-type channel region CH1 are increased synergistically. Thereby, in the read transistor MGA1, at the time of data writing, a high voltage of about 7 [V], which is close to the write source voltage applied to the source line SL1, can be eventually applied to the gate electrode MG1. As a result, the voltage value of the floating gate FG can be surely increased (changed) to a voltage value necessary for generating junction leakage current in the memory transistor MGA2.

(6-1) Other Embodiments

It should be noted that the present invention is not limited to the above described embodiment, and various modifications and variations are possible within the scope and spirit of the present invention. For example, the non-volatile semiconductor memory device may be configured by various numbers of the memory cells 2a, such as one or two of the memory cells 2a. Further, in FIG. 1 to FIG. 6, voltage values of respective portions are specified at the time of the data writing, the data reading, and the data erasing. However, the present invention is not limited to this, and various voltage values may be applied. In the present invention, it is only necessary for the memory transistor MGA2 to be configured such that, at the time of the data writing, junction leakage current can be generated at the end portion of the opposite polarity type impurity diffusion layer 11 in contact with the channel region CH4, and such that the potential of the floating gate FG is set so as to enable generated carriers to be injected into the floating gate FG. For example, the memory transistor MGA2 may be configured such that a voltage of 5 [V] is applied to the impurity diffusion layer 10, such that a voltage of 8 [V] is applied to the gate electrode MG2 serving as the floating gate FG, and such that a voltage of 0 [V] is applied to the opposite polarity type impurity diffusion layer 11.

Further, in the above-described embodiment, a case is described in which the memory transistor MGA2 is formed in the P-type second active region ER2 so as to have an N-channel type MOS structure. However, the present invention is not limited to this, and the memory transistor MGA2 may also be formed in an N-type second active region so as to have a P-channel type MOS structure. In this case, in the memory transistor MGA2, a P-type impurity diffusion layer is formed as the impurity diffusion layer 10, and an N-type opposite polarity type impurity diffusion layer is formed as the opposite polarity type impurity diffusion layer 11. Further, the read transistor MGA1 and the switch transistor SGA are formed, for example, in an N-type first active region so that a P-channel type MOS structure can be configured.

It should be noted that, also in this case, in the memory transistor MGA2, at the time of data writing, the voltage value of the floating gate FG can be changed by the read transistor MGA1 to a voltage value necessary for generating the junction leakage current. For example, in the memory transistor MGA2, in a state where the potential of the well (second active region ER2) is set to 0 [V], a negative voltage is applied to each of the impurity diffusion layer 10 and the gate electrode MG2 serving as the floating gate FG, and a voltage of 0 [V] is applied to the opposite polarity type impurity diffusion layer 11. Thereby, similarly to the above-described embodiment, junction leakage current can be generated at the boundary between the channel region CH4 and the opposite polarity type impurity diffusion layer 11, and thereby holes as carriers can be injected into the floating gate FG by the potential serving as the generation source of the junction leakage current so that the data writing can be performed.

It should be noted that, in the memory transistor MGA2 configured in this way, at the time of the data erasing, data is erased in such a manner that the channel region CH4 is set in the off-state (non-conductive state), that junction leakage current is generated at the boundary between the channel region CH4 and the impurity diffusion layer 10, and that electrons (carriers having the conductivity type opposite to the conductivity type of the carriers (holes) accumulated in the floating gate FG) are injected into the floating gate FG by the potential serving as the generation source of the junction leakage current.

Further, in the above-described embodiment, a case is described in which the non-volatile semiconductor memory device is configured such that data of the memory cell 2a can be erased by respectively applying data erasing voltages to the program/erase lines PL1 and PL2, and the source lines SL1 and SL2. However, the present invention is not limited to this, and the non-volatile semiconductor memory device may also be configured, for example, such that only voltages necessary for data writing are respectively applied to the program/erase lines PL1 and PL2, the source lines SL1 and SL2, and the like, so that, in each of the memory cells 2a, 2b, 2c and 2d, data can be written only once. In this case, the program/erase line (write-erase line) PL1 (PL2) provided at the non-volatile semiconductor memory device 1 in FIG. 1 becomes a mere program line (write line).

Further, in the above-described embodiment, a case is described in which the non-volatile semiconductor memory device is configured such that the switch transistor SGA is provided at each of the memory cells 2a, 2b, 2c and 2d, and such that, at the time of data reading, each of the switch transistors SGA is turned on or off, to allow data of the memory cells 2a and 2b of a certain row to be selectively read among the pair of memory cells 2a and 2c connected to the bit line BL1, and the pair of memory cells 2b and 2d connected to the bit line BL2. However, the present invention is not limited to this, and each of the memory cells 2a and 2b may be configured such that one memory cell 2a (2b) is provided at the bit line BL1 (BL2), and also the bit line BL1 (BL2) is directly connected to one end of the read transistor MGA1 without providing the switch transistor SGA, and such that, at the time of data reading, data is read via the read transistor MGA1 without turning on and off of the switch transistor SGA.

(6-2) Other Embodiments of Read Transistor

Further, in the above-described embodiment, a case is described in which the depletion-type channel region CH1 is formed in the channel layer of the read transistor MGA1, and in which the voltage of the floating gate FG is gradually increased by the synergistic effect between the floating gate FG and the depletion-type channel region CH1. However, the present invention is not limited to this, and the non-volatile semiconductor memory device may also be configured such that a coupling capacitor sharing the floating gate FG is provided separately from the read transistor MGA1, and such that the potential of the floating gate FG is forcibly increased by increasing the potential of the coupling capacitor to high potential, to thereby turn on the channel region CH4 of the memory transistor MGA2.

It should be noted that, in this case, even when the depletion-type channel region CH1 is not formed in the channel layer of the read transistor MGA1, and when only an enhancement-type channel region is formed as the channel layer of the read transistor MGA1, the channel region CH4 of the memory transistor MGA2 can be turned on by the high potential applied from the coupling capacitor.

Further, in the above-described embodiment, a case is described where the read transistor MGA1, in which the extension regions ET1 and ET2 having the same impurity concentration are formed, is applied. However, the present invention is not limited to this, and the read transistor MGA1, which has the extension region ET1 formed at the one end side, and which has a low concentration impurity extension region formed at the other end side electrically connected to the switch transistor SGA, may also be applied. In this case, the read transistor MGA1 can be configured such that the impurity concentration of the low concentration impurity extension region is made lower than the impurity concentration of the extension region ET1, and thereby the resistance value of the low concentration impurity extension region is increased to be high.

In the memory cell 2a having such configuration, at the time of data writing, a large voltage drop is caused only in the low concentration impurity extension region in the read transistor MGA1, so that the voltage of the switch transistor SGA adjacent to the read transistor MGA1 can be suppressed to be low. Thereby, the film thickness of the gate insulating film G3 of the switch transistor SGA can be reduced. It should be noted that, in this case, the impurity dope amount in the low concentration impurity extension region is preferably 1 E18/ cm$^3$ or less.

Further, the read transistor MGA1 provided with such high resistance region may also be configured such that the low concentration impurity extension region is not provided between the channel layer and the source/drain region SD2, and such that the enhancement type channel region CH2 is formed, as it is, to extend to the source/drain region SD2, so that a part of the source/drain region SD2 is formed as a high resistance region. Even in this case, the voltage of the switch transistor SGA adjacent to the read transistor MGA1 can be suppressed to be low similarly to the above-described case.

Incidentally, as another configuration of the read transistor MGA1, in addition to the above-described configuration in which the channel region CH2 is formed in the region from under the floating gate FG to the source/drain region SD2, a configuration may also be adopted, in which, similarly to the other end side configured in this way, also in the one end side, the extension region ET1 is not provided, and the depletion-type channel region CH1 is formed, as it is, to extend to the source/drain region SD1.

Further, as another configuration of the read transistor MGA1, a configuration may also be adopted, in which the channel region CH2 is not formed as an enhancement-type channel region but is formed as a depletion-type channel region, and in which the depletion-type channel region is formed, as it is, to extend to the source/drain region SD2, so that a part of the depletion-type channel region between the region under the floating gate FG and the source/drain region SD2 on the other end side is formed as a high resistance region.

In the case where the extension region ET1 on the one side is formed, the high resistance region at this time can be formed so as to have a resistance value higher than the resistance value of the extension region ET1. Further, also in the case where, in the read transistor MGA1, the depletion-type channel region CH1 is formed, as it is, in a region from under the floating gate FG to the side surface of the source/drain region SD1 without providing the extension region ET1 on the one end side, the resistance value of the depletion-type channel region between the region under the floating gate FG and the source/drain region SD2 may be set higher than the resistance value of the depletion-type channel region CH1 on the one end side.

What is claimed is:

1. A non-volatile semiconductor memory device including one or more memory cells each provided with a memory transistor having a floating gate into which carriers can be injected and a transistor sharing the floating gate with the memory transistor, wherein:
   the memory transistor includes an N-type or P-type impurity diffusion layer formed in an active region, and a P-type or N-type opposite polarity type impurity diffusion layer formed in the active region and having a polarity opposite to the polarity of the impurity diffusion layer;
   a gate electrode serving as the floating gate is arranged, via a gate insulating film, on the active region between the impurity diffusion layer and the opposite polarity type impurity diffusion layer;
   the impurity diffusion layer is electrically connected to a program/erase line;
   the opposite polarity type impurity diffusion layer is short-circuited with the active region and is not electrically connected to the program/erase line; and
   a channel region between the impurity diffusion layer and the opposite polarity type impurity diffusion layer is made conductive, and thereby carriers are injected into the floating gate by potential generated at the boundary between the channel region and the opposite polarity type impurity diffusion layer, and wherein
   the transistor has a depletion-type channel region and an enhancement-type channel region formed in a region under the floating gate.

2. The non-volatile semiconductor memory device according to claim 1, wherein, at the time of injecting the carriers into the floating gate, the transistor changes the voltage value of the floating gate to make the channel region of the memory transistor conductive.

3. The non-volatile semiconductor memory device according to claim 1, wherein
   the transistor is a read transistor, and
   on the basis of a change in a read voltage obtained via the read transistor, the memory cell determines whether or not carriers are injected into the floating gate.

4. The non-volatile semiconductor memory device according to claim 3, wherein the memory cell includes a switch transistor having a switch gate electrode, and
the memory cell has a configuration in which a source line is connected to one end of the read transistor, a bit line is connected to one end of the switch transistor, the other end of the read transistor and the other end of the switch transistor are electrically connected to each other, and the read transistor is arranged in series with the switch transistor.

5. The non-volatile semiconductor memory device according to claim 1, wherein
the memory transistor is configured, at the time of data erasing, to set the channel region in a non-conductive state, and configured to erase data by injecting, into the floating gate, carriers having a polarity opposite to the polarity of the carriers accumulated in the floating gate, by potential generated at the boundary between the channel region and the impurity diffusion layer.

6. The non-volatile semiconductor memory device according to claim 1, wherein
the memory cells are arranged in a row direction and a column direction, wherein
in the memory cells arranged in the row direction, the impurity diffusion layers of the memory transistors are connected to the program/erase line which is shared with the impurity diffusion layers, and
in the memory cells arranged in the column direction, source/drain regions located at one end of the transistors are connected to a source line which is shared with the source/drain regions.

7. The non-volatile semiconductor memory device according to claim 1, wherein
the memory cells are arranged in a row direction and a column direction, wherein
in the memory cells arranged in the row direction, the impurity diffusion layers of the memory transistors are connected to the program/erase line which is shared with the impurity diffusion layers and to which a write voltage or a write inhibit voltage is applied, and
in the memory cells arranged in the column direction, source/drain regions located at one end of the transistors are connected to a source line which is shared with the source/drain regions and to which a write source voltage or a write inhibit source voltage is applied.

8. The non-volatile semiconductor memory device according to claim 1, wherein
the memory cells are arranged in a row direction and a column direction, wherein
in the memory cells arranged in the row direction, the impurity diffusion layers of the memory transistors are connected to the program/erase line which is shared with the impurity diffusion layers and to which a write voltage or a write inhibit voltage is applied, and
in the memory cells arranged in the column direction, source/drain regions located at one end of the transistors are connected to a source line which is shared with the source/drain regions and to which a write source voltage for increasing a potential of the floating gate or a write inhibit source voltage is applied.

* * * * *